(12) United States Patent
Hsu

(10) Patent No.: US 10,304,750 B2
(45) Date of Patent: May 28, 2019

(54) PACKAGE STRUCTURE AND ITS FABRICATION METHOD

(71) Applicant: PHOENIX & CORPORATION, Grand Cayman (KY)

(72) Inventor: Che-Wei Hsu, Hsinchu County (TW)

(73) Assignee: PHOENIX & CORPORATION, Grand Cayman (KY)

(*) Notice: Subject to any disclaimer, the term of this patent is extended or adjusted under 35 U.S.C. 154(b) by 0 days.

(21) Appl. No.: 16/106,107

(22) Filed: Aug. 21, 2018

(65) Prior Publication Data

US 2019/0067140 A1 Feb. 28, 2019

(30) Foreign Application Priority Data

Aug. 22, 2017 (TW) ............... 106128487 A

(51) Int. Cl.
*H01L 23/12* (2006.01)
*H01L 23/52* (2006.01)
(Continued)

(52) U.S. Cl.
CPC .......... *H01L 23/295* (2013.01); *H01L 21/565* (2013.01); *H01L 21/568* (2013.01); *H01L 21/6835* (2013.01); *H01L 23/3135* (2013.01); *H01L 24/02* (2013.01); *H01L 24/19* (2013.01); *H01L 21/561* (2013.01); *H01L 23/3128* (2013.01); *H01L 24/29* (2013.01); *H01L 24/32* (2013.01); *H01L 24/73* (2013.01); *H01L 24/83* (2013.01); *H01L 24/92* (2013.01); *H01L 2221/68345* (2013.01); *H01L 2221/68359* (2013.01); *H01L 2224/024* (2013.01); *H01L 2224/02331* (2013.01); *H01L 2224/02379* (2013.01); *H01L 2224/02381* (2013.01); (Continued)

(58) Field of Classification Search
CPC . H01L 2224/32145; H01L 2224/16145; H01L 23/5329; H01L 23/5226; H01L 21/4867; H01L 29/4958
USPC .................................. 257/750, 758; 438/622
See application file for complete search history.

(56) References Cited

U.S. PATENT DOCUMENTS 7,429,789 B2 * 9/2008 Japp ...................... H01L 23/145
257/634
7,646,098 B2 * 1/2010 Japp ...................... H01L 23/145
257/758

(Continued)

*Primary Examiner* — S. V. Clark
(74) *Attorney, Agent, or Firm* — WPAT, PC

(57) ABSTRACT

A package structure is provided, which includes: a first polymer layer with a first surface; a second polymer layer with a second surface on the first polymer layer; a circuit device with opposing third and fourth surfaces, the circuit device disposed on the second polymer layer and with multiple metal pads on the fourth surface; a first high-filler dielectric layer enclosing the circuit device and the second polymer layer and covering the first polymer layer; a first conductive wiring formed on the first high-filler dielectric layer; a first conductive passage formed in the first high-filler dielectric layer and connecting the first conductive wiring to the metal pads; a second high-filler dielectric layer enclosing the first conductive wiring and covering the first high-filler dielectric layer; and a second conductive passage formed in the second high-filler dielectric layer and connecting the first conductive wiring to an external circuit.

10 Claims, 5 Drawing Sheets

(51) Int. Cl.
*H01L 29/40* (2006.01)
*H01L 23/29* (2006.01)
*H01L 23/00* (2006.01)
*H01L 21/56* (2006.01)
*H01L 23/31* (2006.01)
*H01L 21/683* (2006.01)

(52) U.S. Cl.
CPC ........... *H01L 2224/04105* (2013.01); *H01L 2224/12105* (2013.01); *H01L 2224/214* (2013.01); *H01L 2224/2929* (2013.01); *H01L 2224/29387* (2013.01); *H01L 2224/32225* (2013.01); *H01L 2224/73267* (2013.01); *H01L 2224/82039* (2013.01); *H01L 2224/83005* (2013.01); *H01L 2224/83191* (2013.01); *H01L 2224/92244* (2013.01); *H01L 2224/97* (2013.01); *H01L 2924/1433* (2013.01)

(56) References Cited

U.S. PATENT DOCUMENTS

| | | | |
|---|---|---|---|
| 7,932,606 B2 * | 4/2011 | Hotta | H01L 21/76808 257/774 |
| 8,258,620 B2 * | 9/2012 | Nakasato | H01L 21/6835 257/700 |
| 2002/0171151 A1 * | 11/2002 | Andricacos | H01L 21/76843 257/758 |
| 2015/0280116 A1 * | 10/2015 | Albini | H01L 45/06 257/5 |

* cited by examiner

PACKAGE STRUCTURE AND ITS FABRICATION METHOD

CROSS REFERENCE TO RELATED APPLICATION

This application claims the benefit of Taiwan application Serial No. 106128487, filed on Aug. 22, 2017, the disclosure of which is incorporated by reference herein in its entirety.

FIELD OF THE INVENTION

The present invention relates to a package structure and its fabrication method.

BACKGROUND OF THE INVENTION

As recent rapid trend in modern electronic devices is not only toward lighter and smaller devices, but also toward multi-function and high-performance devices, the integrated-circuit (IC) fabrication and technology has to evolve correspondingly toward a more high-density and miniature design so as to allow more electronic components to be received inside limited chip space. Consequently, the relating IC package structure and the package technology are evolved accordingly to meet the trend.

In the conventional wafer-level or panel-level packaging, a semiconductor die is adhered onto a carrier wafer or a carrier panel by using a removable sticky substance before the molding process of package material. Because of high pressure in the molding process, the semiconductor die may be shifted in position or direction if the adhesion between the semiconductor die and the carrier is not strong enough. Such kind of shift may further cause alignment failures in the formation of the circuitry layer or the redistribution layer (RDL). Therefore, it is in need of a new and advanced packaging solution to reduce the fabrication cost.

SUMMARY OF THE INVENTION

According to one aspect of the present disclosure, one embodiment provides a package structure comprising: a first polymer layer with a first surface; a second polymer layer with a second surface on the first polymer layer; a circuit device with a third surface and an opposite fourth surface, the circuit device disposed on the second polymer layer and with multiple metal pads on the fourth surface; a first high-filler dielectric layer enclosing the circuit device and the second polymer layer and covering the first polymer layer; a first conductive wiring formed on the first high-filler dielectric layer; a first conductive passage formed in the first high-filler dielectric layer and connecting the first conductive wiring to the metal pad; a second high-filler dielectric layer enclosing the first conductive wiring and covering the first high-filler dielectric layer; and a second conductive passage formed in the second high-filler dielectric layer and connecting the first conductive wiring to an external circuit; wherein the first surface is larger than the second surface, and the second surface and the third surface are identical in area size.

In one embodiment, the first polymer layer comprises epoxy-based resin, and the second polymer layer comprises epoxy-based resin.

In one embodiment, the first high-filler dielectric layer comprises a first molding compound, and the second high-filler dielectric layer comprises a second molding compound.

In one embodiment, the circuit device comprises a semiconductor chip or an electronic component.

In one embodiment, the package structure further comprises: a second conductive wiring formed on the second conductive passage and the second high-filler dielectric layer; a protective layer enclosing the second conductive wiring and covering the second high-filler dielectric layer; and a third conductive passage formed in the protective layer and connecting the second conductive wiring to an external circuit.

According to one aspect of the present disclosure, one embodiment provides a method for fabricating a package structure, comprising steps of: providing a carrier and a plurality of circuit devices, the carrier having a first surface, each of the circuit devices having a second surface and an opposite third surface, and each of the circuit devices with multiple metal pads on the third surface; forming a first polymer layer on the carrier, while enabling the first polymer layer to completely cover the first surface of the carrier; forming a second polymer layer on all of the circuit devices, while enabling the second polymer layer to completely cover the second surfaces of the circuit devices; arranging the circuit devices on the carrier, while enabling the second polymer layer to be adhered to the first polymer layer; forming a first high-filler dielectric layer on the carrier, while enabling the first high-filler dielectric layer to cover the circuit devices; forming a first conductive passage in the first high-filler dielectric layer, and forming a first conductive wiring on the first conductive passage, while enabling the first conductive passage to connect the first conductive wiring to the metal pad; forming a second high-filler dielectric layer on the first high-filler dielectric layer, while enabling the second high-filler dielectric layer to enclose the first conductive wiring and cover the first high-filler dielectric layer; forming a second conductive passage in the second high-filler dielectric layer, while enabling the second conductive passage to be connected to the first conductive wiring; removing the carrier to get a semi-finished package structure containing the circuit devices; and dividing the semi-finished package structure into a plurality of package structures, while enabling each of the package structures has one of the circuit devices.

In one embodiment, the first polymer layer is formed by pressing or coating and then baked.

In one embodiment, the second polymer layer is formed by pressing, coating or printing and then baked.

In one embodiment, the first conductive passage is formed by following steps: laser drilling a through opening in the first high-filler dielectric layer on the metal pads of the circuit devices; and filling up the through opening with conducting material by electroplating.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

Figure 1:
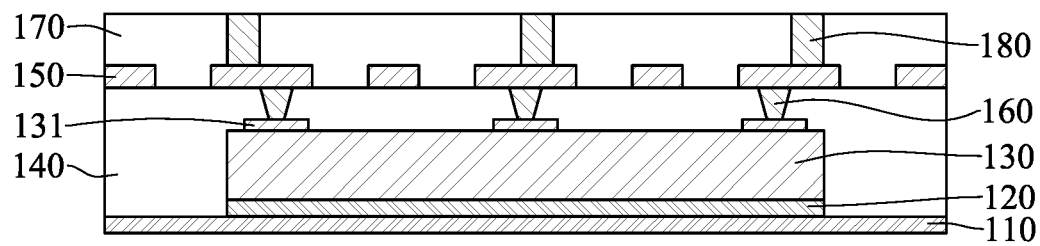
FIG. 1 is a cross-sectional view of the package structure according to a first embodiment of the present invention.

FIG. 1 shows a cross-sectional view of the package structure 100 according to a first embodiment of the present invention. The package structure 100 includes: a first polymer layer 110, a second polymer layer 120, a circuit device 130, a first high-filler dielectric layer 140, first conductive wiring 150, a first conductive passage 160, a second high-filler dielectric layer 170 and a second conductive passage 180; wherein, the second polymer layer 120, the circuit device 130, the first conductive passage 160 and the first high-filler dielectric layer 140 may be combined to form a first package unit, while the first conductive wiring 150, the second conductive passage 180 and the second high-filler dielectric layer 170 may be combined to form a second package unit. The second package unit is stacked on the first package unit to be a surface-mount package structure of land grid array (LGA).

The first polymer layer 110 may be made of a mixture of epoxy-based resin and filler like $SiO_2$ or $Al_2O_3$. The first polymer layer 110 contains a low proportion of filler in the mixture and located at the bottom of the package structure 100. The circuit device 130 may be an electronic component or a semiconductor chip, which is a die diced from a semiconductor wafer following the IC fabrication process. The circuit device 130 is provided with metal pads 131 in the form of pin, pad or solder bump. In the embodiment, the circuit device 130 is an ASIC (Application-Specific Integrated Circuit) or an AP (Application Processor). The second polymer layer 120 may also be made of a mixture of epoxy-based resin and filler like $SiO_2$ or $Al_2O_3$. The second polymer layer 120 contains a low proportion of filler in the mixture and located between the circuit device 130 and the first polymer layer 110. Wherein, the above-recited low proportion means that the filler content is between 5 and 20 percentage by weight (wt %). As shown in FIG. 1, the metal pads 131 are located at the top of the circuit device 130 and the second polymer layer 120 is formed under the bottom of the circuit device 130. The circuit device 130 can be adhered onto the first polymer layer 110 by sticking the bottom of the second polymer layer 120 to the top of the first polymer layer 110. The first polymer layer 110 and the second polymer layer 120 may have either the same filler content or different filler contents. The adhesion between the first polymer layer 110 and the second polymer layer 120 is good because they have similar components, epoxy-based resin especially. The second polymer layer 120 is completely formed on the bottom surface of the circuit device 130; that is, the top surface of the second polymer layer 120 has the same area size as the bottom surface of the circuit device 130. And as shown in FIG. 1, the second polymer layer 120 is smaller than the first polymer layer 110 in area size.

The first high-filler dielectric layer 140 covers the circuit device 130, the second polymer layer 120 and the first polymer layer 110, and the combination of the above four layers is considered the first package unit. The first high-filler dielectric layer 140 can be made of a mixture of a first molding compound and a first filler by a molding means like compression molding. The first filler may be $SiO_2$ or $Al_2O_3$, the first molding compound may be novolac-based resin, epoxy-based resin, or silicon-based resin, and the "high-filler" means that the filler content is between 70 and 90 wt %. Wherein, epoxy molding compound (EMC) is the most common epoxy-based resin in the electronics industry. For example, a commercial EMC may be a mixture of epoxy resin (12-15 wt %), novolac resin (8-10 wt %), and silica filler (70-90 wt %); wherein, the silica filler is a powdered inorganic compound to reduce dielectric constant and dielectric loss in the EMC mixture. Usually, the filler content is 70-90 wt % or more in the molding compound mixture for electronic packaging.

The first conductive passage 160 is formed on the metal pads 131 of the circuit device 130 in the first high-filler dielectric layer 140. It is configured to connect the circuit device 130 to an external circuit outside the first package unit. The first conductive wiring 150 is formed on the first package unit, and the metal pads 131 of the circuit device 130 are connected to the first conductive wiring 150 through the first conductive passage 160. The first conductive wiring 150 may be patterned as a circuitry layer or a redistribution layer (RDL) of the package structure 100. The second high-filler dielectric layer 170 can be formed, in a way similar to the first high-filler dielectric layer 140, on the first conductive wiring 150 and the first high-filler dielectric layer 140. The combination of the first conductive wiring 150 and the second high-filler dielectric layer 170 is considered the second package unit. The second high-filler dielectric layer 170 can be made of a mixture of a second molding compound and a second filler by a molding means like compression molding. The second filler may be $SiO_2$ or $Al_2O_3$, the second molding compound may be novolac-based resin, epoxy-based resin, or silicon-based resin, and the second high-filler dielectric layer 170 may have a filler content between 70 and 90 wt %. The first high-filler dielectric layer 140 and the second high-filler dielectric layer 170 may have either the same filler content or different filler contents. Moreover, the second conductive passage 180 is formed on the first conductive wiring 150 in the second high-filler dielectric layer 170, to connect the circuit device 130 to an external circuit outside the second package unit. In the embodiment, the second conductive passage 180 comprises metal pillars.

Figure 2:
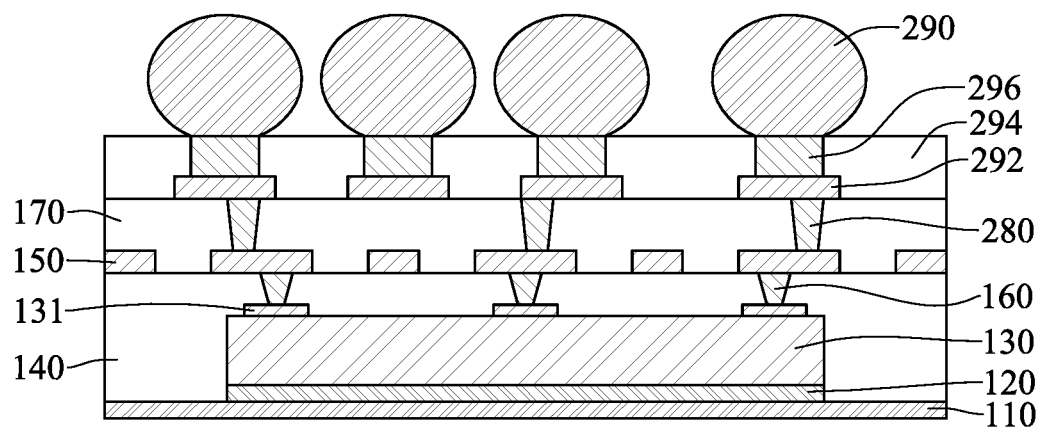
FIG. 2 is a cross-sectional view of a package structure according to a second embodiment of the present invention.

FIG. 2 is a cross-sectional view of a package structure 200 according to a second embodiment of the present invention. The package structure 200 is in many ways identical to the package structure 100 of the first embodiment in FIG. 1, but the second conductive passage 280 comprises metal frustums and the package structure 200 further comprises a second conductive wiring 292, a protective layer 294, a third conductive passage 296 and a solder ball 290. Wherein, the second conductive wiring 292 is formed on the second conductive passage 280 and the second high-filler dielectric layer 170, the protective layer 294 covers the second conductive wiring 292 and the second high-filler dielectric layer 170, the third conductive passage 296 is formed in the protective layer 294, and the solder ball 290 is formed on the third conductive passage 296. The protective layer 294 is configured to protect the package substrate 200 from any adverse affect of its surrounding environment or posterior processes such as soldering. The package structure 200 is designed as a BGA (ball grid array) package, and the circuit device 130 can be connected to an external circuit outside the package structure 200 through the first conductive passage 160, the first conductive wiring 150, the second conductive passage 280, the second conductive wiring 292, the third conductive passage 296 and the solder ball 290.

Figure 3:
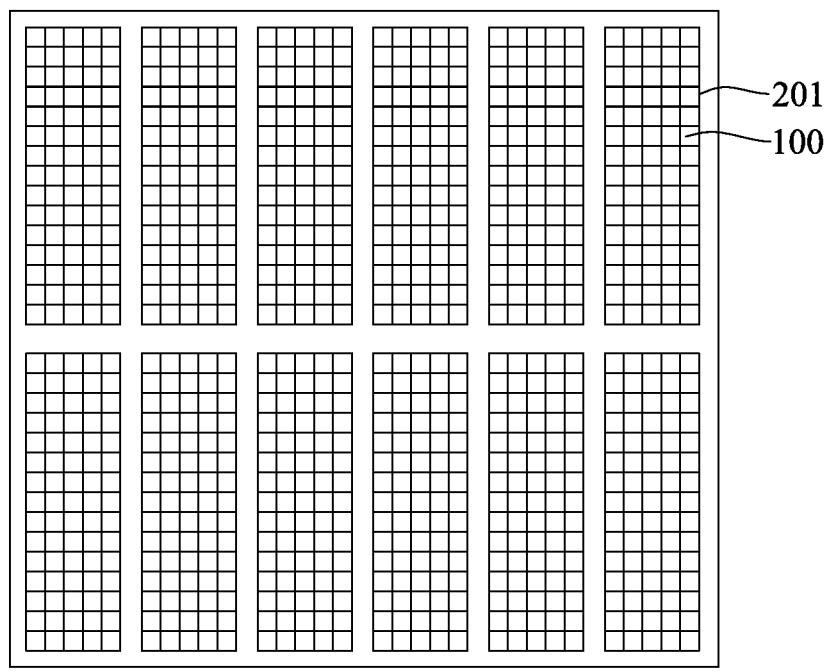
FIG. 3 is a top view of a wafer-level packaging panel with 900 package structures as an example

The fabrication process will be described in detail in the following paragraphs. In the embodiments, the formation of the package structure 100 is based on the wafer-level or panel-level packaging technology. That is, a group of package structure 100 are arranged in a matrix form on a wafer and its carrier substrate, so that a large number of package structures 100 can be concurrently fabricated in the whole process and the wafer is then sliced into individual package structures 100 as shown in FIG. 1. The fabrication process is named as a "wafer-level" or "panel-level" packaging technology because the package structures 100 are concurrently fabricated on a single wafer or panel substrate in the whole process. FIG. 3 shows a top view of a wafer-level packaging panel 300 with 900 package structures 100 as an example. Wherein, 75 package structures 100 are arranged in a 15×5 matrix to form a sub-panel 200, and 12 sub-panels 200 are arranged in a 2×6 matrix to form the whole panel 300.

Figure 4:
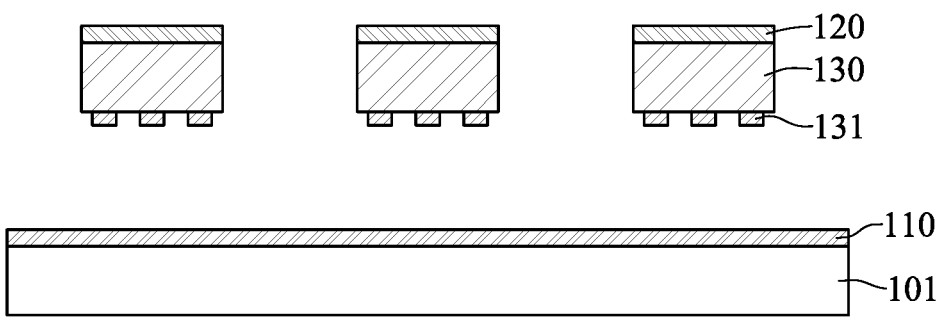
FIG. 4-9 are cross-sectional views of the package structure of the first embodiment in the present disclosure, corresponding to different process steps.

FIGS. 4-9 and 1 are cross-sectional views of the package structure 100 of the first embodiment in the present disclosure, corresponding to different process steps. At first, a carrier substrate 101 and a plurality of circuit devices 130 are provided as shown in FIG. 4. The carrier substrate 101 can be a metal plate or a dielectric plate coated with a metal layer in a wafer-level or panel-level size, to carry and support electronic components and conductive wires of the package structure 100 in the fabrication process, in which the metal can be Fe, Cu, Ni, Sn, Al, Ni/Au or their combination. Each of the circuit devices 130 may be an electronic component or a semiconductor chip, which is a die diced from a semiconductor wafer following the IC fabrication process. The circuit device 130 is provided with metal pads 131 in the form of pin, pad or solder bump. In the embodiment, the circuit device 130 is an ASIC (Application-Specific Integrated Circuit) or an AP (Application Processor). As shown in FIG. 4, the metal pads 131 are located at the bottom of the circuit device 130.

Next, as shown in FIG. 4, a first polymer layer 110 is formed on the carrier substrate 101 by coating or pressing, while enabling the first polymer layer 110 to cover the whole upper surface of the carrier substrate 101. The first polymer layer 110 is then baked and hardened on the carrier substrate 101. The first polymer layer 110 may be made of a mixture of epoxy-based resin and filler like $SiO_2$ or $Al_2O_3$. The first polymer layer 110 contains a low proportion of filler in the mixture and located at the bottom of the package structure 100. On the other hand, a second polymer layer 120 is formed on the upper surface of the circuit device 130 by pressing, coating or printing, while enabling the second polymer layer 120 to cover the whole upper surface of the circuit device 130. The second polymer layer 120 is then baked and hardened on the circuit device 130. The second polymer layer 120 may also be made of a mixture of epoxy-based resin and filler like $SiO_2$ or $Al_2O_3$. The second polymer layer 120 contains a low proportion of filler in the mixture and located between the circuit device 130 and the first polymer layer 110. Wherein, the above-recited low proportion means that the filler content is between 5 and 20 wt %. The first polymer layer 110 and the second polymer layer 120 may have either the same filler content or different filler contents.

Figure 5:
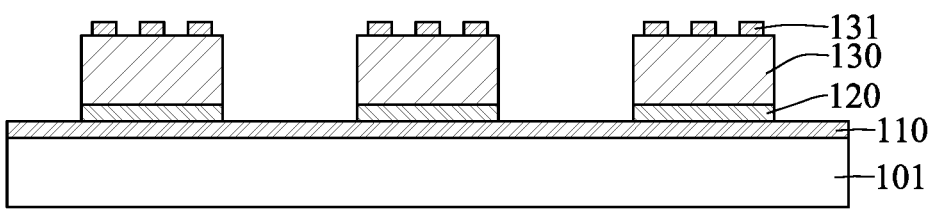

Next, the circuit device 130 is turned upside down and then arranged on the carrier substrate 101, while enabling the second polymer layer 120 to be adhered onto the first polymer layer 110 as shown in FIG. 5. Because of strong adhesion between the first polymer layer 110 and the second polymer layer 120, it can effectively prevent the circuit device 130 from being shifted in position or direction in the high-pressure molding process. The first polymer layer 110 is completely formed on the top surface of the carrier substrate 101, and the second polymer layer 120 is completely formed on the bottom surface of the circuit device 130. As shown in FIG. 5, the bottom surface of the first polymer layer 110 has the same area size as the top surface of the circuit device 130, the top surface of the second polymer layer 120 has the same area size as the bottom surface of the circuit device 130, and the second polymer layer 120 is smaller than the first polymer layer 110 in area size.

Figure 6:
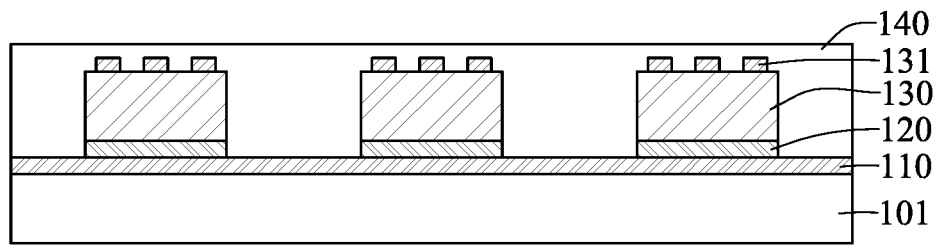

Next, as shown in FIG. 6, a first high-filler dielectric layer 140 is formed on the carrier substrate 101 to enclose the circuit device 130 and cover the first polymer layer 110 by using a molding means like compression molding. The second polymer layer 120, the circuit device 130, and the first high-filler dielectric layer 140 are combined to be the first package unit. The first high-filler dielectric layer 140 can be made of a mixture of a first molding compound and a first filler by a molding means like compression molding. The first filler may be $SiO_2$ or $Al_2O_3$, the first molding compound may be novolac-based resin, epoxy-based resin, or silicon-based resin, and the "high-filler" means that the filler content is between 70 and 90 wt %. Wherein, epoxy molding compound (EMC) is the most common epoxy-based resin in the electronics industry. For example, a commercial EMC may be a mixture of epoxy resin (12-15 wt %), novolac resin (8-10 wt %), and silica filler (70-90 wt %); wherein, the silica filler is a powdered inorganic compound to reduce dielectric constant and dielectric loss in the EMC mixture. Usually, the filler content is 70-90 wt % or more in the molding compound mixture for electronic packaging.

Figure 7:
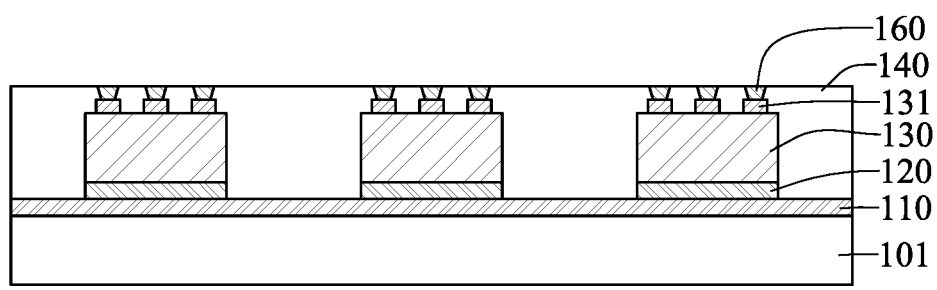

Next, a plurality of first conductive passages 160 are formed on the metal pads 131 of the circuit device 130 in the first high-filler dielectric layer 140 as shown in FIG. 7. It can be performed by first laser drilling (or laser ablating)

through openings on the terminals 131 and then filling the through openings with conductive material by electroplating. The first conductive passages 160 are configured to connect the circuit device 130 to an external circuit outside the first package unit.

Figure 8:
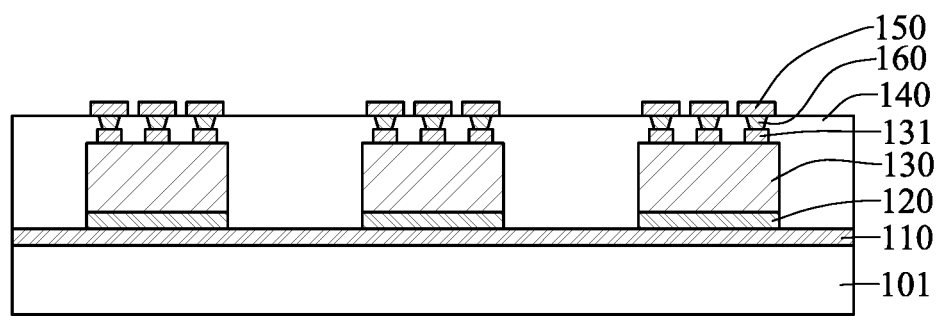

Next, as shown in FIG. 8, a metal layer is formed on the first high-filler dielectric layer 140 by using the electroplating means, and then the metal layer is patterned to be a fine-pitch first conductive wiring 150. Through the first conductive passages 160, the circuit device 130 can be connected to the first conductive wiring 150.

Figure 9:
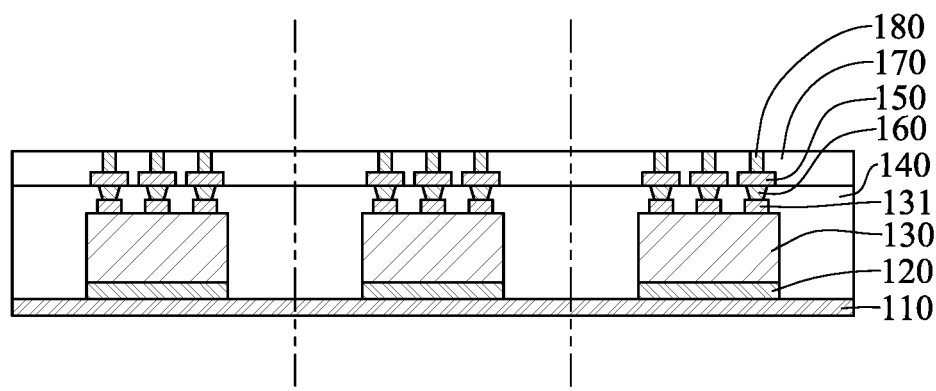

Next, as shown in FIG. 9, a second high-filler dielectric layer 170 can be formed, in a way similar to the first high-filler dielectric layer 140, on the first high-filler dielectric layer 140 enclosing the first conductive wiring 150. The combination of the first conductive wiring 150 and the second high-filler dielectric layer 170 is considered a second package unit. Also, a plurality of second conductive passages 180 are formed on the first conductive wiring 150 in the second high-filler dielectric layer 170, in a way similar to the first conductive passages 160, to connect the circuit device 130 to an external circuit outside the second package unit. In the embodiment, the second conductive passages 180 are metal pillars. The second high-filler dielectric layer 170 can be made of a mixture of a second molding compound and a second filler. The second filler may be $SiO_2$ or $Al_2O_3$, and the second molding compound may be novolac-based resin, epoxy-based resin, or silicon-based resin. The first high-filler dielectric layer 140 and the second high-filler dielectric layer 170 may have either the same filler content or different filler contents.

Next, the carrier substrate 101 is removed to get a semi-finished package structure 102 containing the circuit devices 130. The semi-finished package structure 102 can be divided into a plurality of package structures 100 as shown in FIG. 1, while enabling each of the package structures 100 has one of the circuit devices 130.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A package structure comprising:
a first polymer layer with a first surface;
a second polymer layer with a second surface on the first polymer layer;
a circuit device with a third surface and an opposite fourth surface, the circuit device disposed on the second polymer layer and with multiple metal pads on the fourth surface;
a first high-filler dielectric layer enclosing the circuit device and the second polymer layer and covering the first polymer layer;
a first conductive wiring formed on the first high-filler dielectric layer;
a first conductive passage formed in the first high-filler dielectric layer and connecting the first conductive wiring to the metal pad;
a second high-filler dielectric layer enclosing the first conductive wiring and covering the first high-filler dielectric layer; and a second conductive passage formed in the second high-filler dielectric layer and connecting the first conductive wiring to an external circuit;
wherein the first surface is larger than the second surface, and the second surface and the third surface are identical in area size.

2. The package structure of claim 1, wherein the first polymer layer comprises epoxy-based resin, and the second polymer layer comprises epoxy-based resin.

3. The package structure of claim 1, wherein the first high-filler dielectric layer comprises a first molding compound, and the second high-filler dielectric layer comprises a second molding compound.

4. The package structure of claim 1, wherein the circuit device comprises a semiconductor chip or an electronic component.

5. The package structure of claim 1, further comprising:
a second conductive wiring formed on the second conductive passage and the second high-filler dielectric layer;
a protective layer enclosing the second conductive wiring and covering the second high-filler dielectric layer; and
a third conductive passage formed in the protective layer and connecting the second conductive wiring to an external circuit.

6. The package structure of claim 5, wherein the second conductive passage comprises a metal pillar.

7. A method for fabricating a package structure, comprising steps of:
(A) providing a carrier and a plurality of circuit devices, the carrier having a first surface, each of the circuit devices having a second surface and an opposite third surface, and each of the circuit devices with multiple metal pads on the third surface;
(B) forming a first polymer layer on the carrier, while enabling the first polymer layer to completely cover the first surface of the carrier;
(C) forming a second polymer layer on all of the circuit devices, while enabling the second polymer layer to completely cover the second surfaces of the circuit devices;
(D) arranging the circuit devices on the carrier, while enabling the second polymer layer to be adhered to the first polymer layer;
(E) forming a first high-filler dielectric layer on the carrier, while enabling the first high-filler dielectric layer to cover the circuit devices;
(F) forming a first conductive passage in the first high-filler dielectric layer, and forming a first conductive wiring on the first conductive passage, while enabling the first conductive passage to connect the first conductive wiring to the metal pad;
(G) forming a second high-filler dielectric layer on the first high-filler dielectric layer, while enabling the second high-filler dielectric layer to enclose the first conductive wiring and cover the first high-filler dielectric layer;
(H) forming a second conductive passage in the second high-filler dielectric layer, while enabling the second conductive passage to be connected to the first conductive wiring;
(I) removing the carrier to get a semi-finished package structure containing the circuit devices; and
(F) dividing the semi-finished package structure into a plurality of package structures, while enabling each of the package structures has one of the circuit devices.

8. The method of claim 7, wherein the first polymer layer is formed by pressing or coating and then baked in step (B).

9. The method of claim 7, wherein the second polymer layer is formed by pressing, coating or printing and then baked in step (C).

10. The method of claim 7, wherein the first conductive passage is formed by following steps:
   laser drilling a through opening in the first high-filler dielectric layer on the metal pads of the circuit devices; and
   filling up the through opening with conducting material by electroplating.

\* \* \* \* \*